*(12)* United States Patent
Kent et al.

(10) Patent No.: US 7,417,197 B2
(45) Date of Patent: Aug. 26, 2008

(54) DIRECT CONTACT POWER TRANSFER PAD AND METHOD OF MAKING SAME

(75) Inventors: Harold B. Kent, Portola Valley, CA (US); James J. Levante, Redwood City, CA (US)

(73) Assignee: Medconx, Inc., Santa Clara, CA (US)

( * ) Notice: Subject to any disclaimer, the term of this patent is extended or adjusted under 35 U.S.C. 154(b) by 188 days.

(21) Appl. No.: 10/946,379

(22) Filed: Sep. 20, 2004

(65) Prior Publication Data
US 2005/0139383 A1    Jun. 30, 2005

Related U.S. Application Data

(60) Provisional application No. 60/504,055, filed on Sep. 19, 2003.

(51) Int. Cl.
*H01R 12/04* (2006.01)
(52) U.S. Cl. .................. 174/261; 361/771; 361/772; 361/774; 361/777; 361/794
(58) Field of Classification Search ................. 307/149; 174/262–266, 255; 439/65; 345/63; 361/777, 361/788–785
See application file for complete search history.

(56) References Cited

U.S. PATENT DOCUMENTS

| | | | | |
|---|---|---|---|---|
| 4,632,857 A | * | 12/1986 | Mallory, Jr. | 428/209 |
| 4,778,950 A | | 10/1988 | Lee et al. | |
| 4,933,810 A | * | 6/1990 | Cardashian et al. | 361/749 |
| 6,210,781 B1 | * | 4/2001 | Baum et al. | 428/209 |
| 6,224,388 B1 | * | 5/2001 | Ahr et al. | 439/55 |
| 6,459,032 B1 | * | 10/2002 | Luch | 136/244 |
| 6,541,147 B1 | * | 4/2003 | McLean et al. | 429/35 |
| 6,913,477 B2 | | 7/2005 | Dayan et al. | |

OTHER PUBLICATIONS

International Search Report, Dec. 8, 2006, PCT.

* cited by examiner

*Primary Examiner*—Dean A. Reichard
*Assistant Examiner*—Abiy Getachew
(74) *Attorney, Agent, or Firm*—Jones Day

(57) ABSTRACT

A power transfer pad, having: a non-conductive board having a top and a bottom; a plurality of conductive substrate sections disposed across the top of the non-conductive board; at least one conducting element disposed on each of the conductive substrate sections; a plurality of electrical contacts on the bottom of the non-conductive board, wherein each of the electrical contacts on the bottom of the non-conductive board are in electrical communication with one of the conductive substrate sections on the top of the non-conductive board.

43 Claims, 15 Drawing Sheets

DIRECT CONTACT POWER TRANSFER PAD AND METHOD OF MAKING SAME

RELATED APPLICATIONS

This application claims priority under 35 U.S.C. § 119 to U.S. Provisional Application No. 60/504,055 entitled Method for Manufacturing a Charging Plate and filed on Sep. 19, 2003.

TECHNICAL FIELD

The present invention relates to a method of manufacturing power transfer and charging plates used for supplying power to various electrical devices sitting thereon without the use of wires or standard electrical connectors for connectivity.

BACKGROUND OF THE INVENTION

Various electrical devices (including, but not limited to cell phones, PDA's, laptops, tools, medical equipment, et.) can be powered by being placed on top of a charging plate. The charging plate then determines the type and amount of power required and then supplies power to the electrical device, which can, among other things, recharge the batteries of the device.

A first advantage of using a charging plate is that the device can be re-charged or powered without using cords. The user thereby avoids the problem of having to connect the device to a standard plug-in-the-wall power cord.

A second advantage of charging plates is that the electrical device to be powered can be placed on top of the charging plate in any position or orientation. This makes the charging plate very convenient for a user for several reasons. For example, users can simply place a cell phone to be re-charged anywhere on the charging plate and it starts charging. As such, the user does not need to orient the device in any specific direction or location.

A third advantage of charging plates is that they can be used for powering a plurality of devices at the same time. This is particularly advantageous in that it avoids the "Christmas Tree" tangle of power cords typically found when re-charging or powering a number of devices on a desk or countertop. Instead, using a charging pad, each of these devices can be placed next to one another on the same charging pad and they will each receive the proper amount of power.

There are two main types of charging pads: inductive (i.e.: magnetic) coupling charging pads and direct contact charging pads.

A main disadvantage of charging pads has been their cost. Current Charging pads have also been thick due to the need to contain all the electronics necessary to run the pad inside the device. As a consequence, it has been difficult to integrate existing charging pads into common items such as car dashboards, desks, countertops, floor tiles, etc. An inductive charger is also inherently less desirable because of the large amounts of EMI generated as a consequence of running large coils of wire at high power. Because these AC waves are used to power the devices in question, they inherently become EMI which becomes extremely difficult to effectively shield from other nearby devices (computers, radios, televisions, etc.)

SUMMARY OF THE INVENTION

In preferred embodiments, the present invention provides a power transfer pad, having: a non-conductive board having a top and a bottom; a plurality of conductive substrate sections disposed across the top of the non-conductive board; at least one conducting element disposed on each of the conductive substrate sections; and a plurality of electrical contacts on the bottom of the non-conductive board, wherein each of the electrical contacts on the bottom of the non-conductive board are in electrical communication with one of the conductive substrate sections on the top of the non-conductive board.

In further preferred embodiments, the present invention also includes a non-conductive material disposed across the top of the non-conducting board, wherein the raised conducting elements protrude through the non-conducting material, and wherein the non-conductive material covers the conductive substrate sections and isolates the conductive substrate sections from one another.

A first advantage of the present invention is that it can be mass produced at low cost using standard manufacturing techniques.

A second advantage of the invention is that it provides minimal electro-magnetic and radio-frequency interference to both the device being powered and any nearby devices.

A third advantage of the present invention is that it is very thin. As such, it can easily be built into, affixed or mounted onto counters, tabletops and almost any other surface.

A fourth advantage of the present invention is that the individual electrical contact points on the top of the charging pad can be positioned artistically so as to display a graphical image on the charging plate (such as a corporate logo or a work of art).

A fifth advantage of the present invention is that the charging plate can easily be made flexible, thereby adding to the potential for integration with both new and existing devices.

A sixth advantage is that the present invention allows for the separation of the controlling electronics and the charging areas.

BRIEF DESCRIPTION OF THE DRAWINGS

FIG. 2I is the assembly of FIG. 2H, but with a solder mask added to cover the sections of the copper plates on the top and bottom of the charging plate, but not to cover the conductive material electroplated onto the copper plates in FIG. 2C.

DETAILED DESCRIPTION OF THE DRAWINGS

The present invention provides a novel direct contact charging and power plate design and method of manufacturing same. As will be shown, the present charging plate offers numerous advantages over existing charging plates. Such advantages include performance advantages in both the charging plate design itself, and also in the manufacture of the charging plate.

Figure 1A:
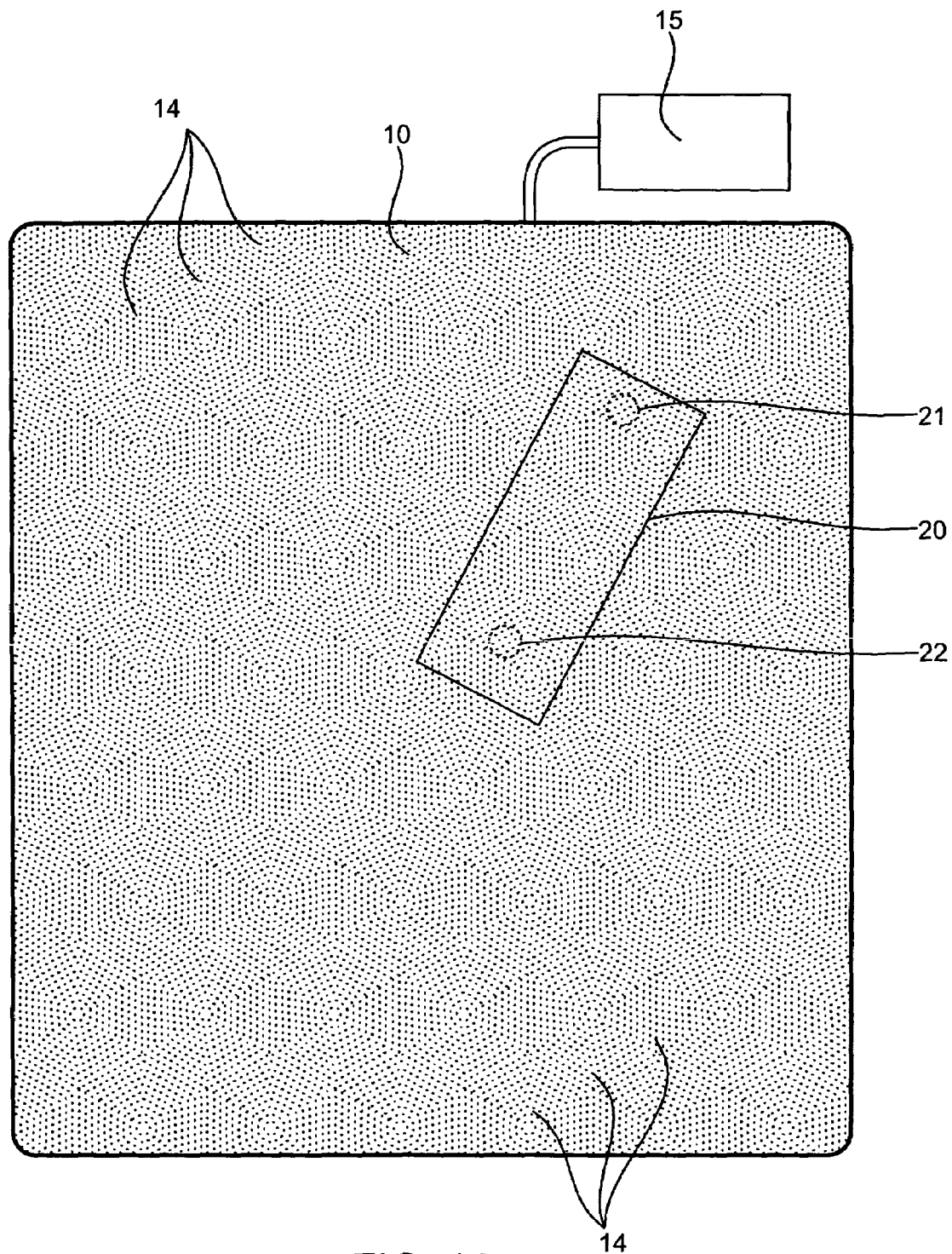
FIG. 1A is a top plan view of a charging plate according to the present invention (showing a repeating pattern of individual raised conducting elements) with a device positioned thereon for charging.
Figure 1B:
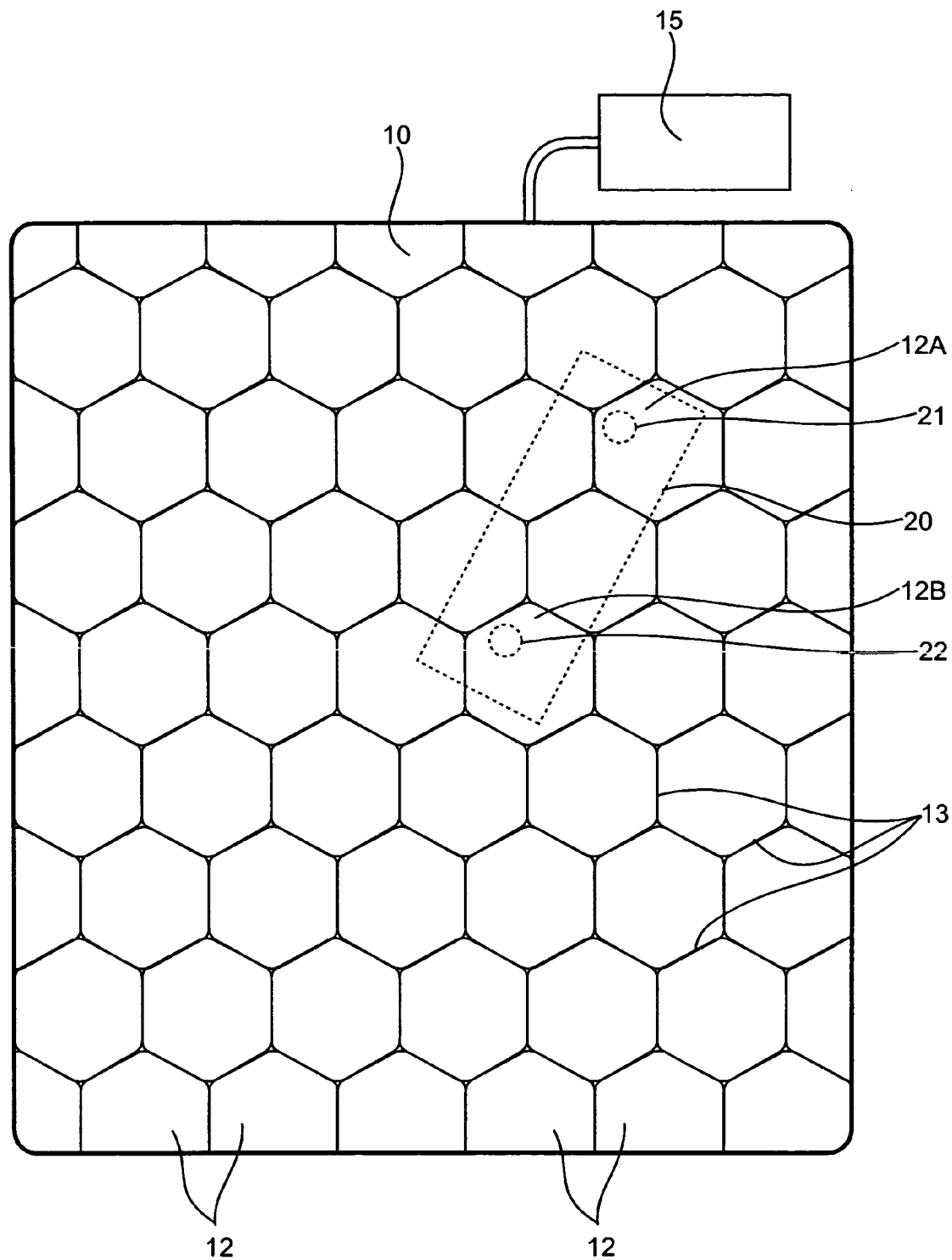
FIG. 1B is top plan view corresponding to FIG. 1A, but with the top layer of the charging plate and the individual raised conducting elements removed (showing the individual sections of conducting substrate to which the raised conducting elements are attached).

FIGS. 1A and 1B show respective top and bottom views of an exemplary embodiment of the present charging plate.

FIGS. 2A to 2I show sequential steps in the manufacture of the exemplary embodiment of the present charging plate of FIGS. 1A and 1B.

Figure 3A:
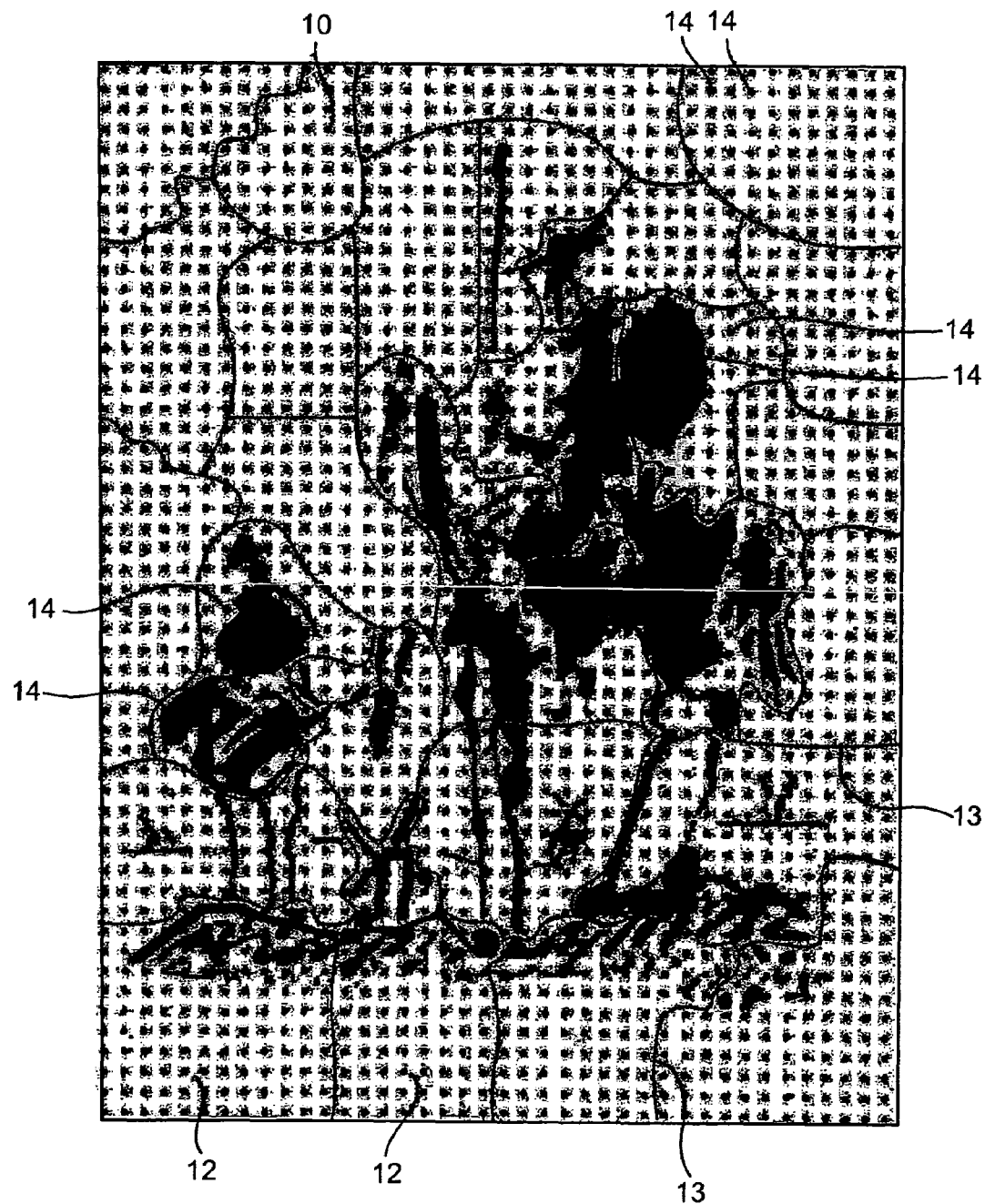
FIG. 3A is a first example of a graphical patterns of raised conducting elements disposed across the top of the charging plate.
Figure 3B:
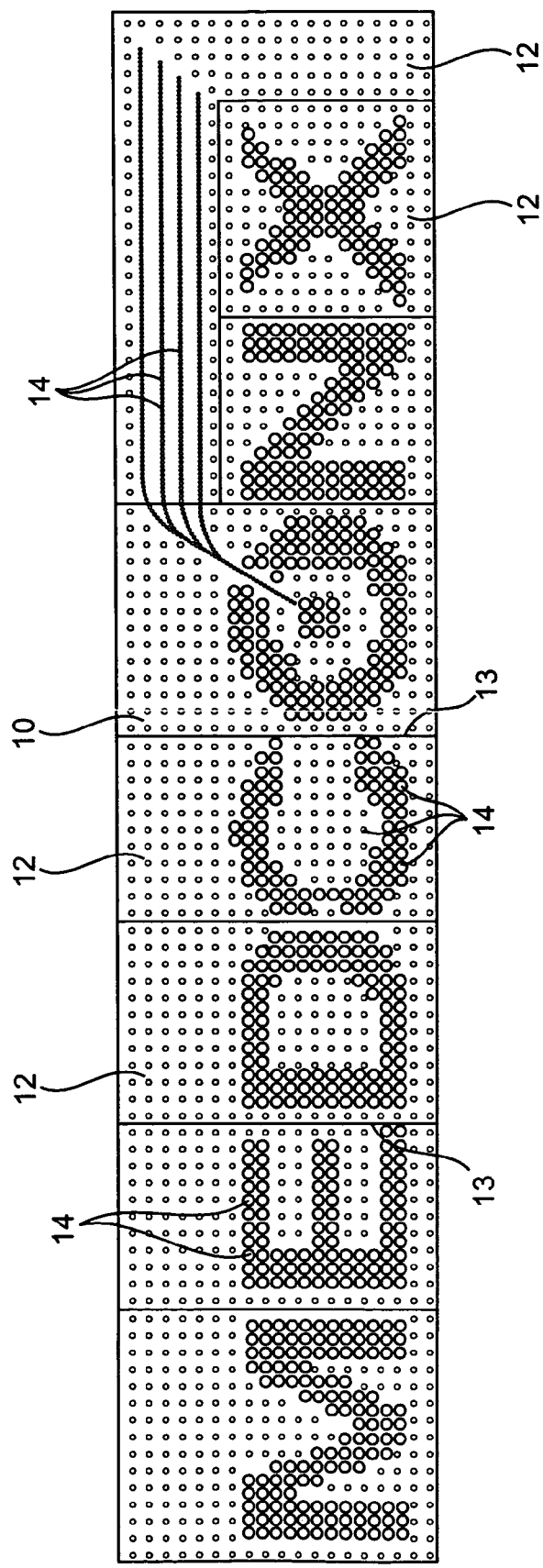
FIG. 3B is a second example of a graphical patterns of raised conducting elements disposed across the top of the charging plate.

FIGS. 3A and 3B show examples of artistic graphical patterns of raised conducting elements disposed across the top of the charging plate.

Referring first to FIGS. 1A and 1B, a charging plate 10 is provided. Charging plate 10 is formed with a plurality of individual conductive substrate sections 12 (FIG. 1B). A plurality of raised conducting elements 14 are positioned on top of individual conductive substrate sections 12 (FIG. 1A). As will be explained, each of the conductive substrate sections 12 is electrically isolated from one another. As illustrated in FIG. 1B, conductive substrate sections 12 may be hexagonal. However, conductive substrate sections 12 may be other shapes, including, but not limited to, rectangular (FIG. 4B) or irregular shaped (FIG. 4A). Each of the conductive substrate sections 12 have at least one (but preferably a plurality) of raised conducting elements 14 attached thereto. In preferred embodiments, the conductive substrate sections 12 are covered by a non-conductive material, with the raised conducting elements 14 protruding through the non-conductive material.

A device 20 to be powered is placed on top of charging plate 10. Device 20 may comprise a cell phone, PDA, laptop, tools, medical devices, lamps, speakers, electrically heated coffee cups, electrically heated dishes, or any other electrical device. The bottom of device 20 has a positive contact 21 and a negative contact 22 (shown in dotted lines). It is to be understood that the dimensions of device 20 and contacts 21 and 22 is merely exemplary and is shown for ease of illustration purposes only.

When device 20 is placed onto charging plate 10, positive contact 21 will be positioned on top of at least one raised conducting element 14 on at least one conductive substrate section 12A. Similarly, negative contact 22 will be positioned on top of at least one raised conducting element 14 on at least one conductive substrate section 12B.

In accordance with the present invention, logical circuitry 15 is provided in communication with charging pad 10. Logical circuitry 15 operates to first identify conductive substrate sections 12A and 12B. In other words, logical circuitry 15 first determines which particular conductive substrate sections 12 are positioned below each of positive contact 21 and negative contact 22. Then, logical circuitry 15 operates to determine which contact on device 20 is positive contact 21 and which contact on device 20 is negative contact 22.

When this determination has been made, charging plate 10 provides positive charge at the requested voltage and for the requested time to conductive substrate section 12A, and negative charge at the requested voltage and for the requested time to conductive substrate section 12B, thereby charging device 20. During the charging of device 20, the remaining conductive substrate sections 12 are not activated but are continually scanned for new devices.

When device 20 is picked up and taken off of charging plate 20, the active conductive substrate sections (12A and 12B) are turned off. Later, the user may re-place device 20 back on top of the charging plate (but in a different position on the charging plate). At that time, logic circuitry 15 re-identifies which conductive substrate sections 12 are placed under (i.e.: in contact with) positive contact 21 and negative contact 22. Then, conductive substrate sections 12A and 12B are identified and charged accordingly, to once again provide power to device 20.

Figure 1C:
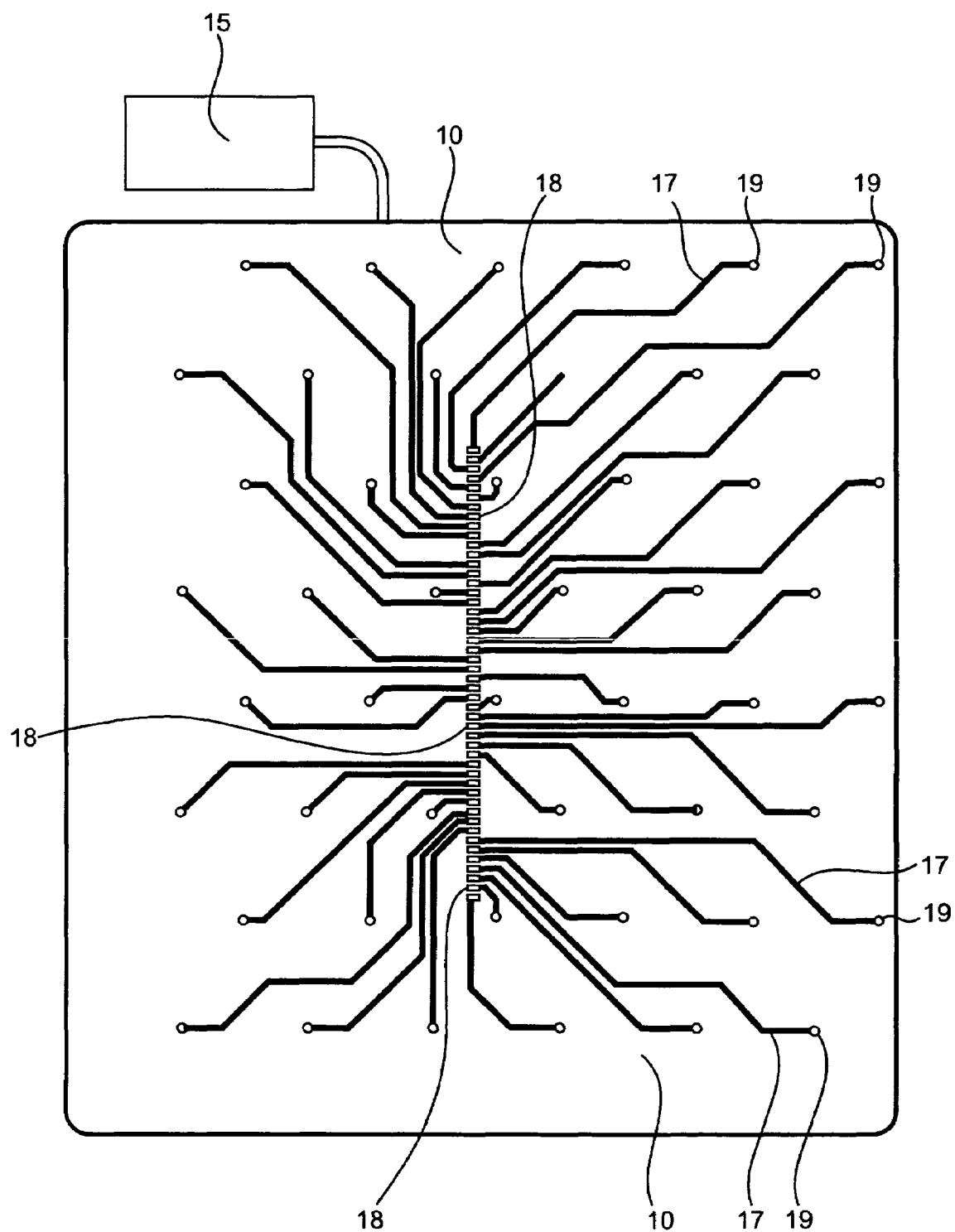
FIG. 1C is a bottom plan view of the charging plate of FIG. 1A.

As shown in FIG. 1C, a plurality of electrical contacts 18 are provided on the bottom of charging plate 10. Each electrical contact 18 is in electrical communication with one of the conductive substrate sections 12 on the top of charging plate 10. Such electrical communication may be provided through traces 17 connected to vias 19 passing through charging plate 10. As will be explained further herein, such vias 19 provide one-to-one electrical communication between individual electrical contacts 18 on the bottom of charging pad 10 and individual conductive substrate sections 12 on the top of charging pad 12 which in turn are connected to the raised conducting elements 14.

Figure 1D:
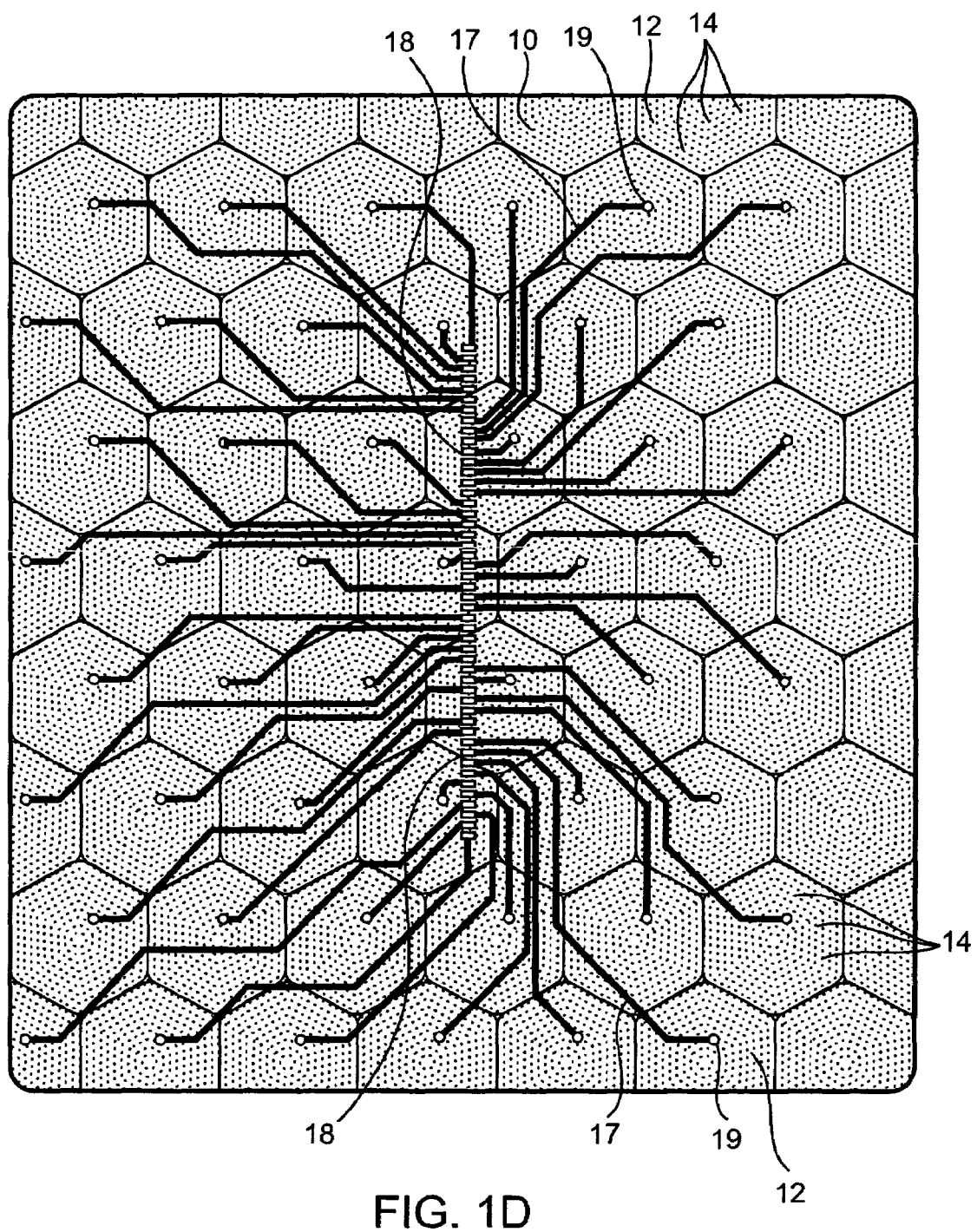
FIG. 1D is a composite illustration of the charging plate of FIGS. 1A to 1C.

FIG. 1D shows a composite view of charging plate 10 in which: (a) a repeating pattern of conductive substrate sections 12 are distributed across charging plate 10; (b) a plurality of raised conducting elements 14 are disposed on top of each of conductive substrate sections 12; (c) a via 19 is found on each conductive substrate section 12; and a trace 17 connects the individual vias 19 to individual electrical contacts 18 on the bottom of charging pad 10.

As a result, each individual electrical contact 18 on the bottom of charging pad 10 is electrically connected to the raised conducting elements 14 found on each of the conductive substrate sections 12.

As shown above, conductive substrate sections 12 are dimensioned such that different conductive substrate sections (e.g.: 12A and 12B) are positioned under respective positive and negative contacts 21 and 22 in device 20 when device 20 is positioned in any particular orientation on top of charging plate 10.

Also, in accordance with the present invention, raised conducting elements 14 are dimensioned such that at least one raised conducting element 14 contacts each of the respective positive and negative contacts 21 and 22 in device 20 regardless of what particular orientation device 20 is positioned on top of charging plate 10.

Also in accordance with the present invention, raised conducting elements 14, conductive substrate sections 12, positive contact 21, and negative contact 22 are dimensioned such that, no matter what size device 20 is, positive contact 21 is always in contact with at least one unique raised conducting element 14 on one unique substrate section 12 and negative contact 22 is always in contact with at least one unique raised conducting element 14 on one unique substrate section 12. In other words is shall be impossible for positive contact 21 and negative contact 22 to be in any type of contact with the same conductive substrate section 12.

Referring next to FIGS. 2A to 2I, respective steps for a novel method for manufacturing charging plate 10 is provided.

Figure 2A:
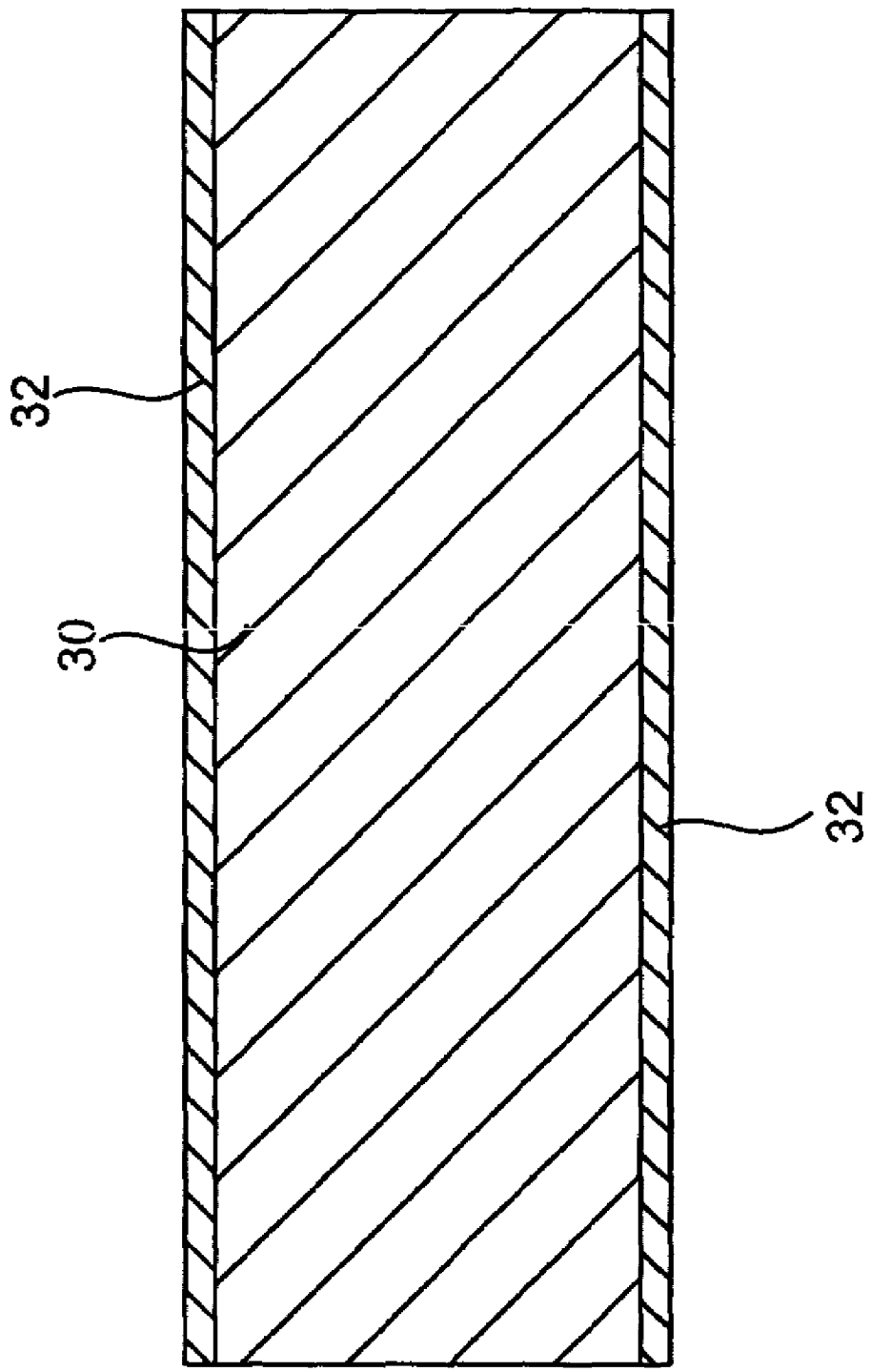
FIG. 2A is a section of a non-conductive printed circuit board having a copper plate on its top and bottom.

In FIG. 2A, a non-conductive material 30 is provided with a sheet of conductive substrate 32 one its top and bottom. In exemplary embodiments, non-conductive material 30 is a standard printed circuit board that may be made of FR-4 (also known as G10). It is a Printed Circuit Board laminate that is the most commonly used base material for printed circuit boards. The "FR" means Flame Retardant (to UL94V-0), and Type "4" indicates woven glass reinforced epoxy resin. It is to be understood that non-conductive board 30 may be made of any suitable electrically non-conducting material. In exemplary embodiments, conductive substrates 32 are copper layers. It is to be understood, however, that conductive substrates 32 may be made of any suitable electrically conducting material. Moreover, the conductive substrates 32 on the top and bottom of board 30 may be made of the same material, or of different materials.

Figure 2B:
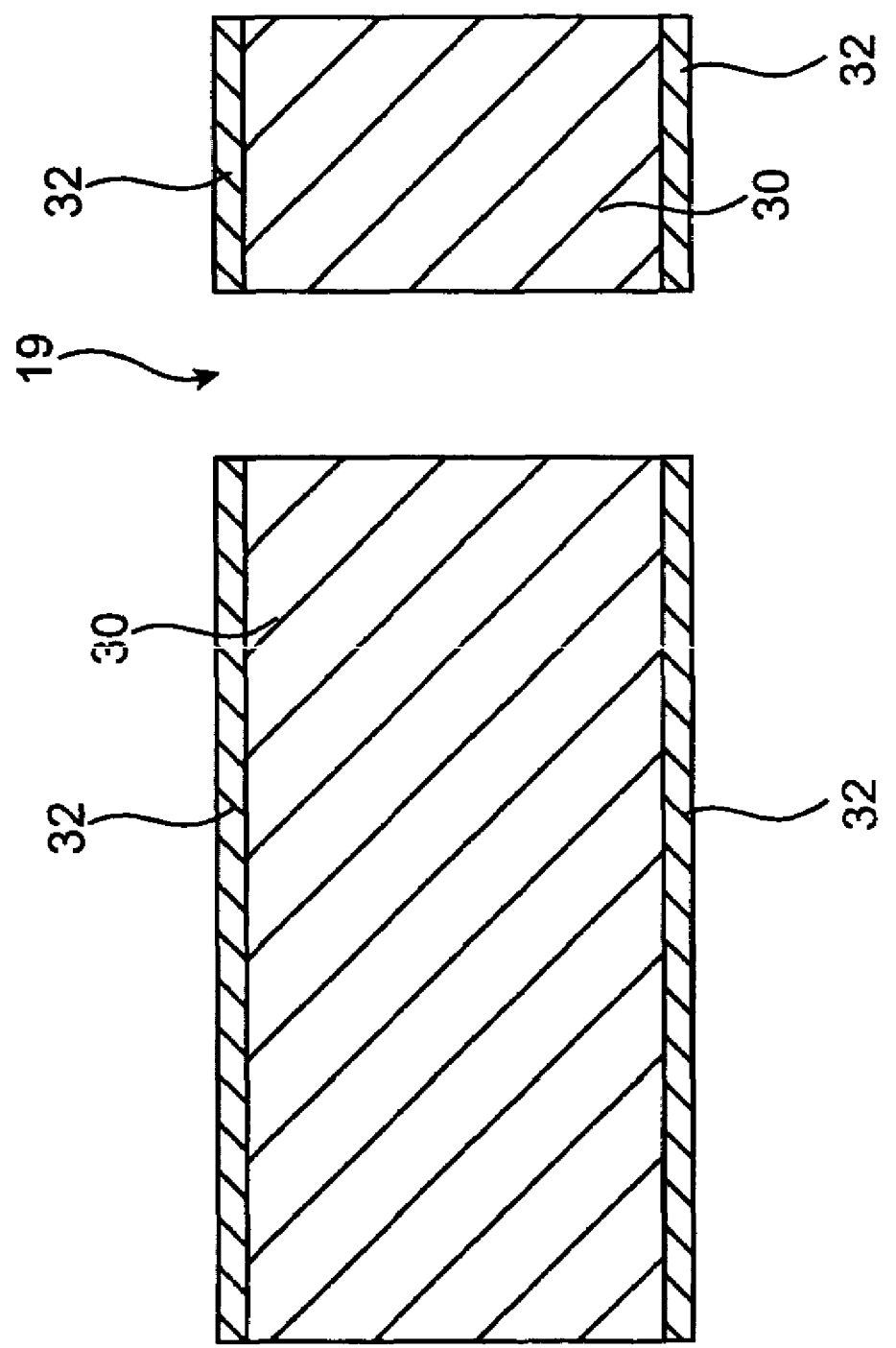
FIG. 2B is the assembly of FIG. 2A, but with a via drilled therethrough.

Next, as shown in FIG. 2B, a via 19 is drilled (or otherwise formed) through non-conductive material 30 and sheets of conductive substrate 32.

Figure 2C:
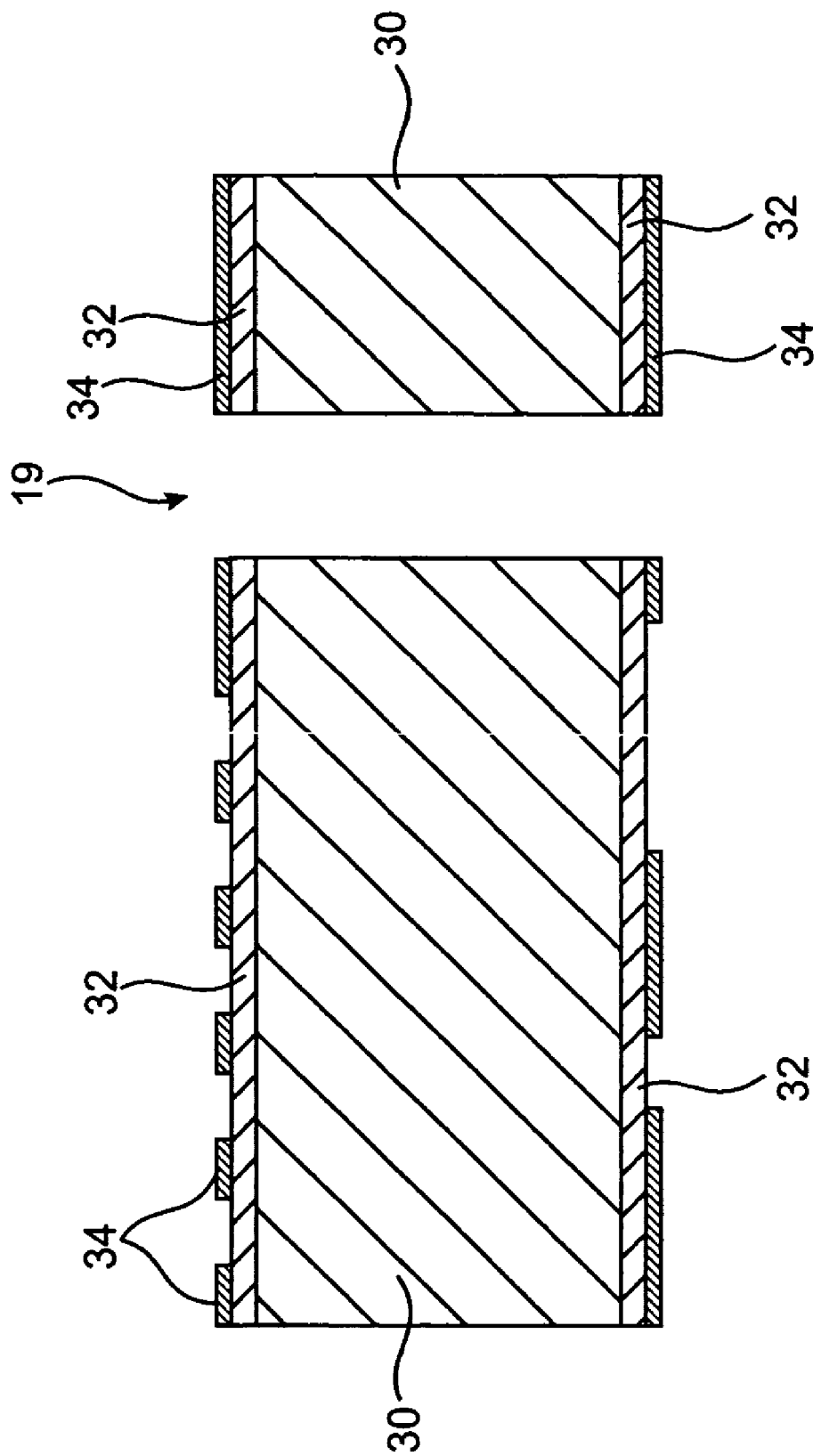
FIG. 2C is the assembly of FIG. 2B, but with a first solder mask deposited thereon.

As shown in FIG. 2C, a first patterned solder mask 34 is deposited (e.g: photo exposed) onto conductive substrates 32 on the top and bottom of board 30. As can be seen, first patterned solder mask 34 only covers portions of conductive substrates 32.

Figure 2D:
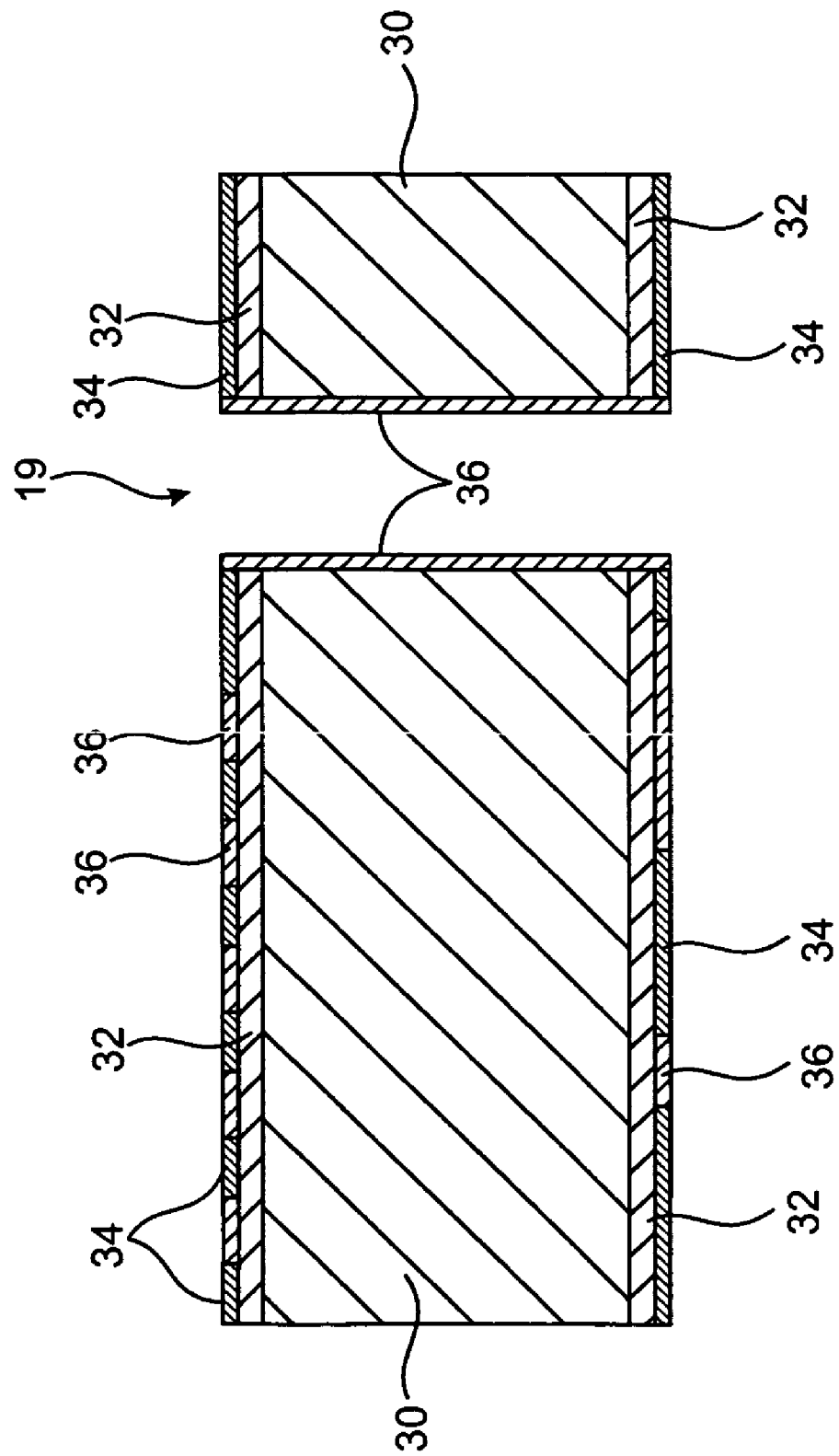
FIG. 2D is the assembly of FIG. 2C, but with conductive material electroplated onto those regions of the copper plate not covered by the first patterned solder mask.

Next, as shown in FIG. 2D, conductive material is added onto the exposed regions of conductive substrates 32, thereby forming raised conducting elements 36 thereon. In preferred embodiments, raised conducting elements 36 are formed from the same material as conductive substrates 32. For example, raised conducting elements 36 may be formed by electroplating copper directly onto copper substrate 32. Other materials and deposition techniques may also be used. In one exemplary embodiment, nickel is placed onto the board in much the same was a conventional surface mount solder paste, namely the nickel paste is squeegeed into the holes formed from the soldermask. This nickel paste can then be heated in an oven to harden the nickel into a solid form which is still conductive. These nickel bumps can then be further plated with another conductive material, preferably of the same material as the conductive substrate 32. This has the advantage of taking far less time in the plating tank, and hence being far cheaper to manufacture, while still providing the same bump features and conductivity as a feature that was made of one homogenous material.

As also shown in FIG. 2D, a copper deposition 36 will be formed in the interior of via 19. In one preferred method, copper deposition 36 in via 19 is formed in a two step process. First, copper in solution is added, forming a thin copper deposition in via 19. This thin deposition will form an electrical connection between the conductive substrates 32 on the top and bottom of board 30. Then, a thicker layer of copper deposition can be added by electroplating material onto the thin copper deposition. In preferred embodiments, depositions 36 in via 19 may be integral with conductive substrates 32 on the top and bottom of board 30. In other words, depositions 36 may be formed of the same continuous block of material forming conductive substrates 32.

As can be seen in FIG. 2D, copper depositions 36 in via 19 may be disposed only along the edges of via 19. Alternately, depositions 36 may completely fill via 19. Alternately, vias 19 may be partially (or fully) filled with solder.

Figure 2E:
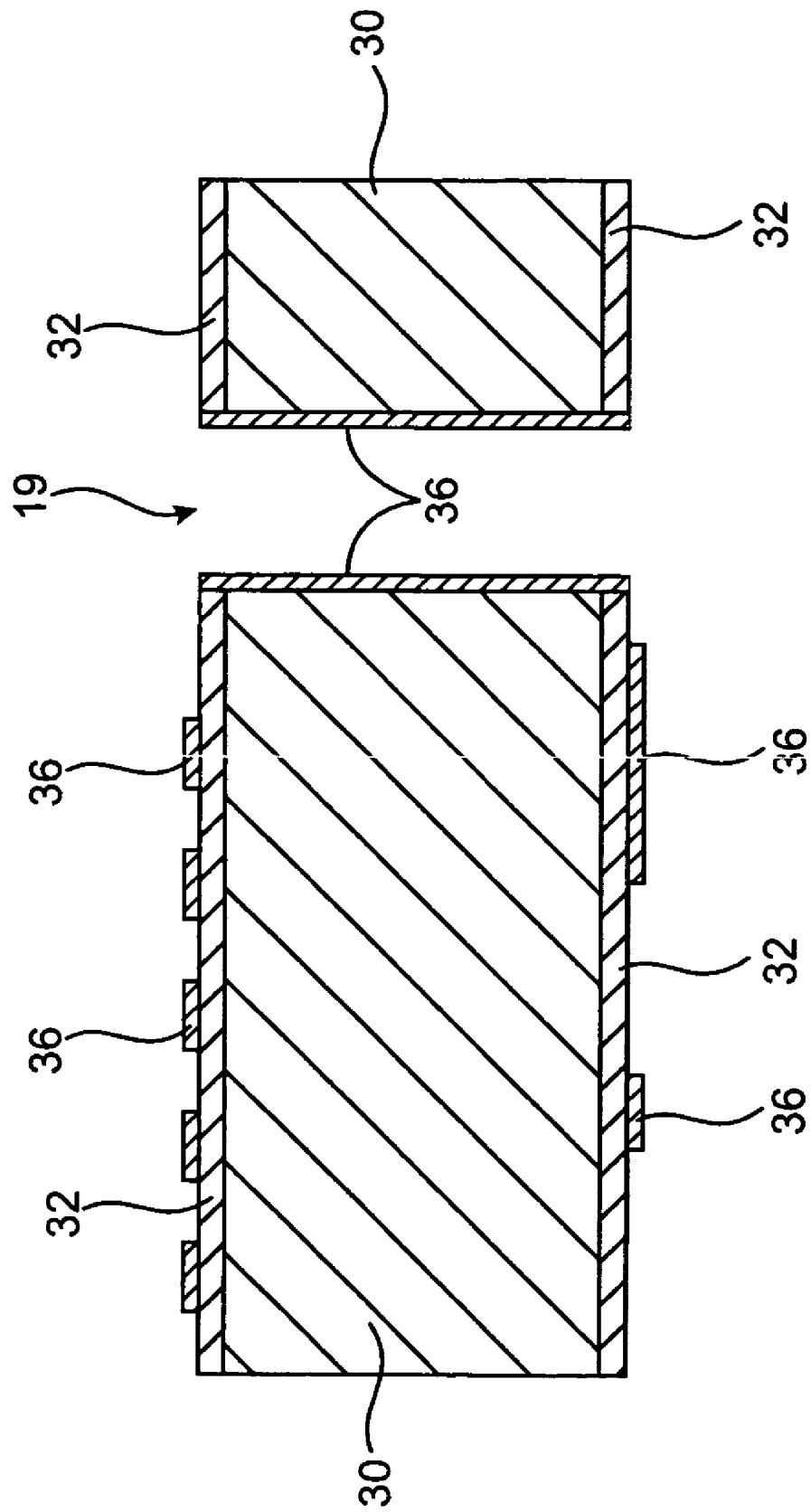
FIG. 2E is the assembly of FIG. 2D, but with the first solder mask removed.

Next, as shown in FIG. 2E, first patterned solder mask 34 is removed (e.g.: by chemical stripping).

Figure 2F:
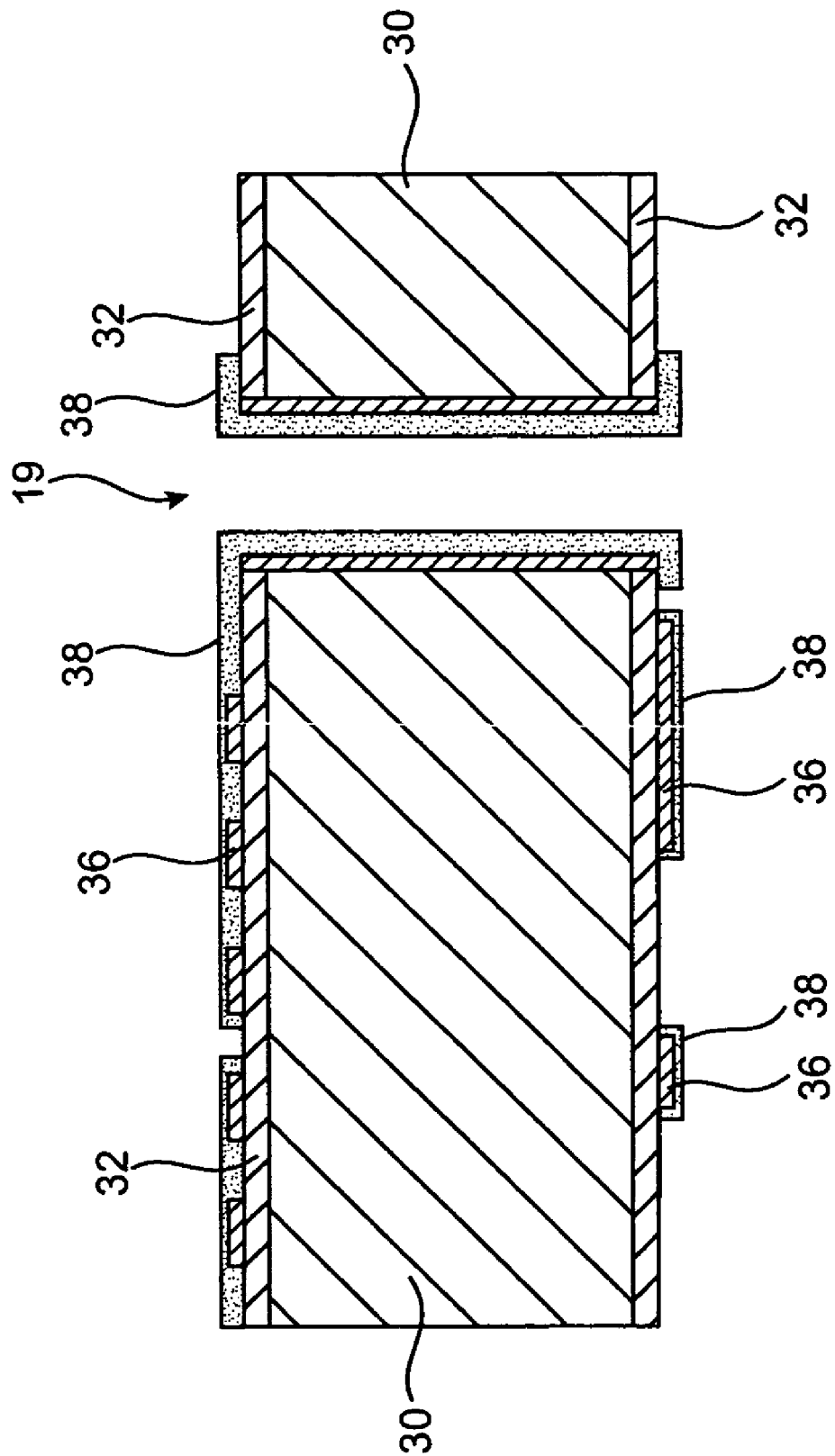
FIG. 2F is the assembly of FIG. 2E, but with a second patterned deposited thereon.

Next, as shown in FIG. 2F, a second patterned solder mask 38 is deposited (e.g: photo exposed) onto conductive substrates 32 and raised conducting elements 36. As can be seen, second patterned solder mask 38 may completely cover raised conducting elements 36, but only cover portions of conductive substrates 32. The second patterned solder mask 38 can also be used to section a raised conducting element 36.

Figure 2G:
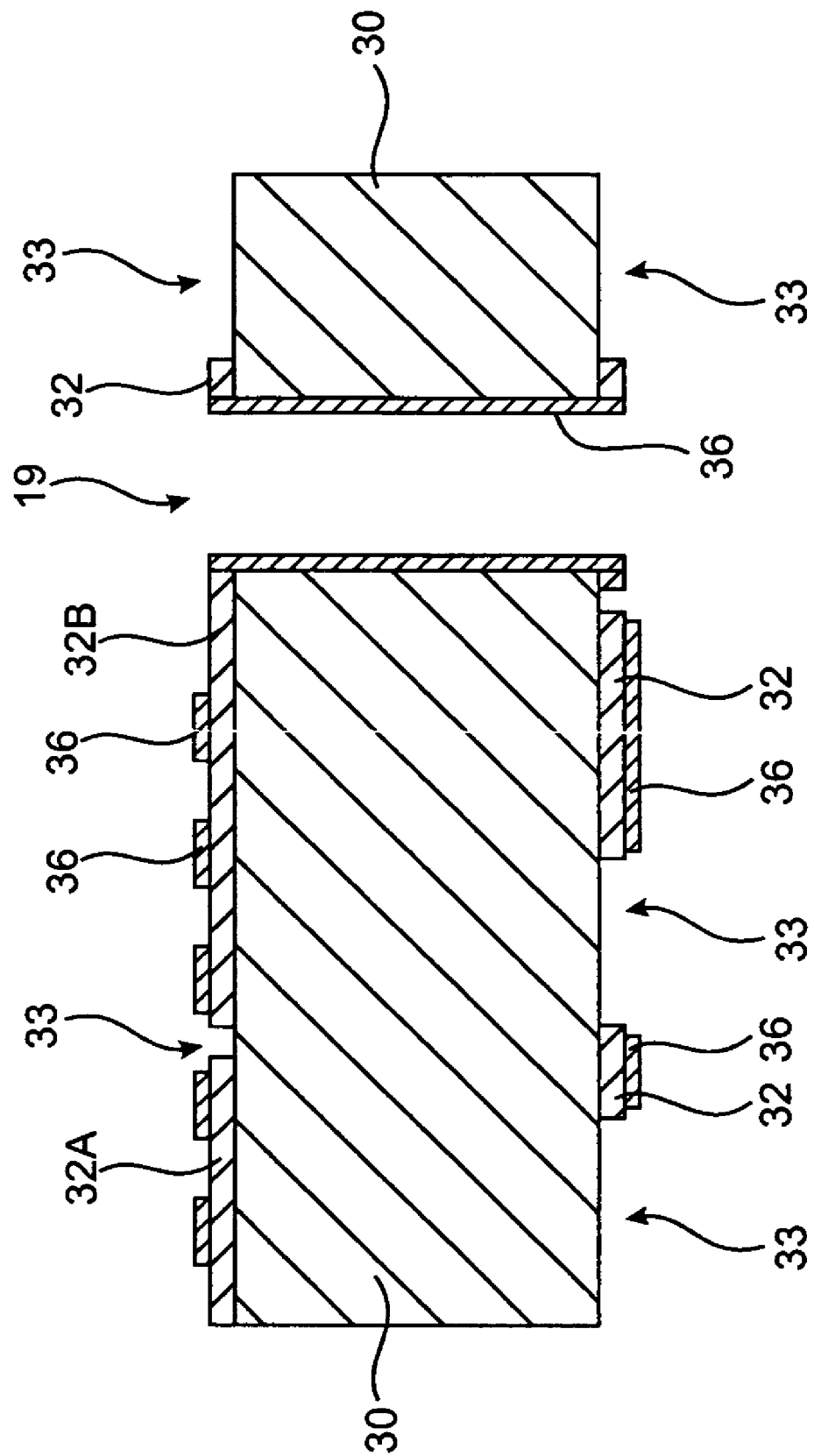
FIG. 2G is the assembly of FIG. 2F, but with regions of the copper plate not covered by the second solder mask removed, and with the second solder mask removed.

Next, as shown in FIG. 2G, the regions of conductive substrates 32 that are not covered by second patterned solder mask 38 are then removed. In preferred embodiments, this may be accomplished by submerging the assembly in a chemical etchant and chemically etching away the exposed regions of conductive substrates 32. This step has the important effect of electrically isolating individual sections (e.g.: 32A and 32B) from one another. In preferred embodiments, such electrically isolated individual sections 32A and 3B may be formed to be hexagonal in shape, thereby forming conductive substrate sections 12 as shown in FIG. 1B. Specifically, the voids 33 between electrically isolated individual sections 32A and 32B in FIG. 2G form the channels 13 between conductive substrate sections 12 in FIG. 1B.

Figure 2H:
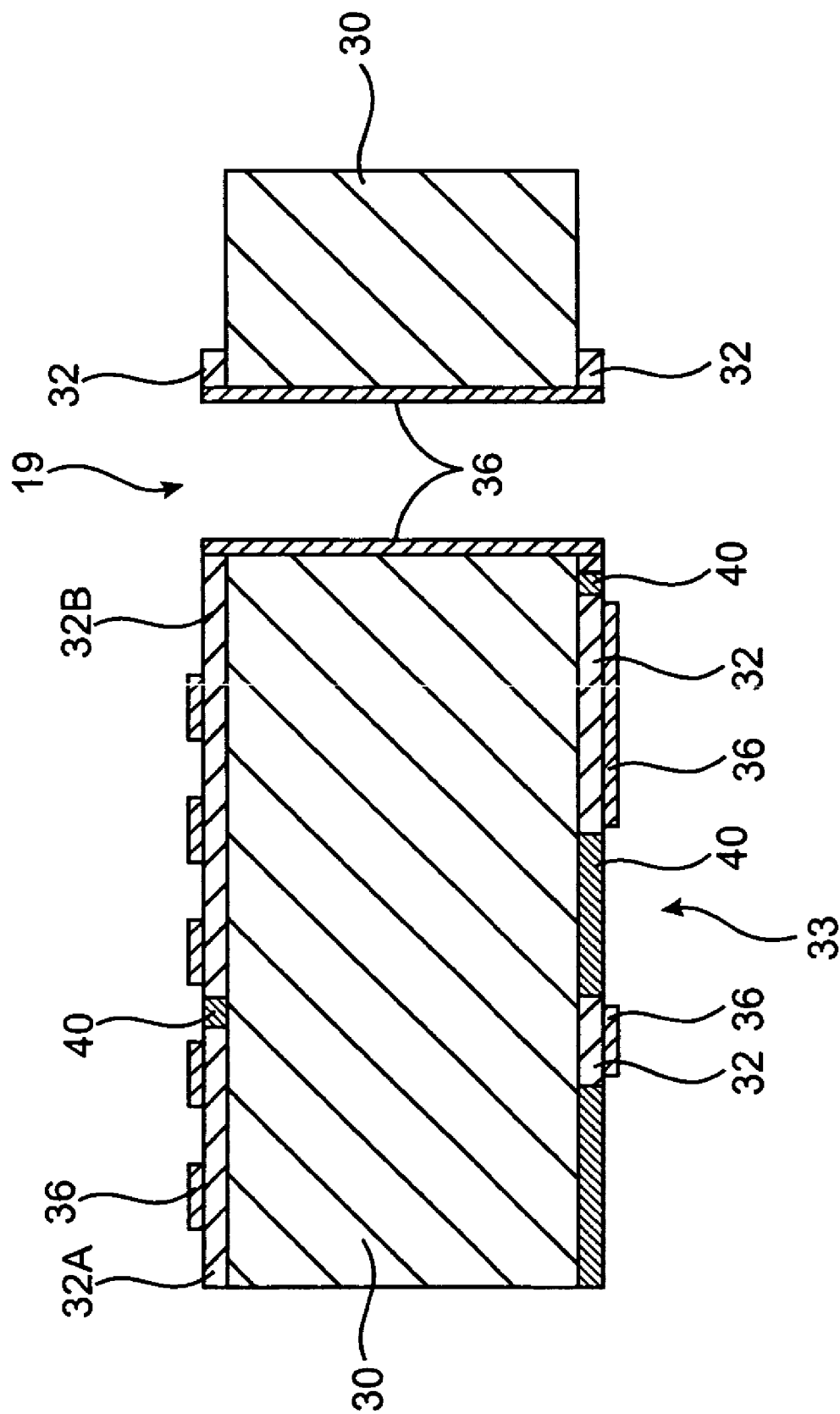
FIG. 2H is the assembly of FIG. 2G, but with a filler added in the regions between individual sections of the copper plates on the top and bottom of the charging plate.
Figure 21:
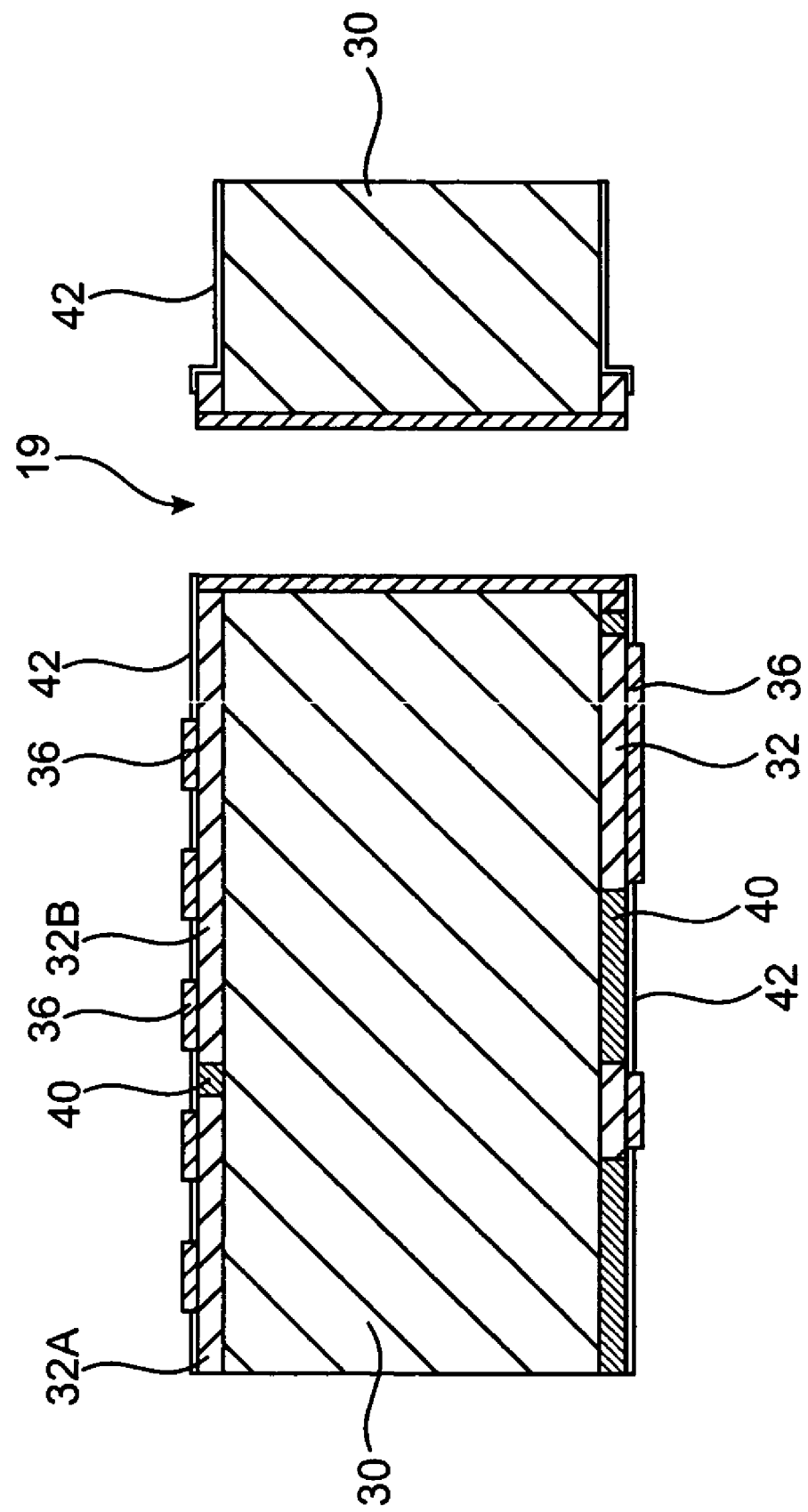

Next, as shown in FIG. 2H, second patterned solder mask 38 is removed (e.g.: by chemical stripping); and a non-conductive material 40 is deposited across the voids 33 formed between individual adjacent conductive substrate sections 32 in FIG. 2F. Such non-conductive material 40 has the effect of further electrically isolating individual conductive substrate sections 32A and 32B from one another. Preferably, non-conductive material 40 fills the voids such that the top surface of material 40 is generally parallel and coplanar with the top surface of conductive substrates 32, as shown.

Next, as shown in FIG. 2I, a non-conductive material 42 is deposited across conductive substrates 32 such that the conductive substrates 32 are fully covered by non-conductive material 42, but with the raised conducting elements 36 protruding therethrough. This is seen in FIG. 1A where raised conducting portions 14 (i.e.: raised conducting elements 36) are disposed across the top of charging plate 10. As a result, any charge applied to an individual conducting substrate (e.g.: 32A) is applied to the raised conducting elements 36 extending therefrom. As a result of the steps shown in FIGS. 2A to 2I, charging plate 10 is formed.

It is to be understood that non-conductive materials 40 and 42 may be made of the same material, or they may be different materials. Moreover, the application of non-conductive materials 40 and 42 to board 30 and to conductive substrates 32 may be carried out in a single step, simply using one non-conductive material to both cover and electrically isolate individual conductive substrates 32.

FIGS. 2A to 2I above show a preferred method of manufacturing charging plate 10 with raised conducting elements 36 on both its top and bottom surfaces. Preferably, the pattern of raised conducting elements 36 on the top of charging plate 10 correspond to the embodiment shown in FIGS. 1A and 1B. For example, conductive substrates 32 correspond to hexagonal shaped conductive substrate sections 12; and the regions where non-conductive material 40 is deposited between conductive substrates 32 correspond to the hexagonal shaped boundary lines between conductive substrate sections 12. In addition, raised conducting elements 36 correspond to raised conducting element 14.

Similarly, the pattern of raised conducting elements 36 on the bottom of charging plate 10 corresponds to the embodiment shown in FIG. 1C.

As illustrated in FIGS. 3A and 3B, a unique advantage of the present charging plate 10 is that raised conducting elements 14 can be placed in various artistic graphical patterns across its top surface. For example, raised conducting elements 14 can be placed in a simple repeating pattern across portions of charging plate 10, but with larger, irregularly shaped raised conducting elements 14 also disposed thereon. As can be seen in FIG. 3A, a work of art can be made simply by raised conducting elements 14 (i.e.: the darkened portions of the figure). In various embodiments, the size, spacing, and shape of individual raised conducting elements 14 can be varied to produce endless artistic designs. For example, FIG. 3B shows an embodiment of the invention with the Medconx™ logo formed by raised conducting elements 14 having different size and positioning. FIG. 3B also shows an embodiment of the invention in which the charging plate is rectangular, but not square.

In addition, FIGS. 3A and 3B show that the individual shape of conductive substrate sections 12 need not be hexagonal. For example, in FIG. 3A, individual conductive substrate sections 12 have irregular shapes, while in FIG. 3B, individual conductive substrate sections 12 are rectangular (or L-shaped). It is to be understood that any and all shapes, both geometric and irregular can be used either alone or in conjunction with one another for both the raised conductive surfaces 14 and the conductive substrates 12.

In alternate embodiments, individual raised conducting elements 14 can be positioned closer together to create a visually lighter (or darker) region on the top of charging plate 10, or farther apart to create a visually darker (or lighter) region on the top of charging plate 10. Whether a particular region of charging plate 10 will be lighter or darker will depend upon the respective color of the raised conducting elements 14, and that of non-conductive material 42 on the surface of the charging plate. Moreover, the surface texture of the individual raised conducting elements 14 can be varies across the charging plate such that portions of the top of the charging plate are lighter or darker (or just have a different appearance) than one another.

Such graphical patterns of raised conducting elements 36 across the top of charging plate 10 may be formed in various ways. For example, raised conducting elements 36 may be formed in a simple repeating pattern across the top of the non-conducting board (as shown in FIG. 1A). Alternately, raised conducting elements 36 may be of equal dimensions to one another, or be of different dimensions.

As explained above, the present invention provides a charging plate 10, including: a non-conductive board 30 having a top and a bottom; a plurality of conductive substrate sections 12 or 32 disposed across its top; at least one raised conducting element 36 disposed on each of the conductive substrate sections; a non-conductive material 42 disposed across the top of the of non-conductive board 30, wherein the raised conducting elements 36 protrude through non-conductive material 42, and wherein non-conductive material 40 covers conductive substrate sections 12 or 32 and isolates conductive substrate sections 32 from one another; and a plurality of electrical contacts 32 on the bottom of non-conductive board 30, wherein each of the electrical contacts 32 on the bottom of non-conductive board 32 are in electrical communication with one of the conductive substrate sections 32 on the top of non-conductive board 30.

What is claimed is:

1. A power transfer pad, comprising:
   a non-conductive board having a top and a bottom;
   a plurality of conductive substrate sections disposed across the top of the non-conductive board;
   at least one conducting element disposed on each of the conductive substrate sections wherein the conducting elements define an exposed top surface of the power transfer pad for temporary placement of an electrical device having a positive contact and a negative contact for charging the electrical device;
   a plurality of electrical contacts on the bottom of the non-conductive board, wherein each of the electrical contacts on the bottom of the non-conductive board are in electrical communication with one of the conductive substrate sections on the top of the non-conductive board; and
   logic circuitry configured to identify the positive contact and the negative contact of the electrical device when the electrical device is placed on the power transfer pad, wherein the positive and negative contacts are identified by determining that a first one of the conductive substrate sections is electrically coupled to the positive contact and a second one of the conductive substrate sections is electrically coupled to the negative contact,
   the logic circuitry being further configured to cause the plurality of electrical contacts to supply a positive charge to the positive contact via the first one of the conductive substrate sections and to supply a negative charge to the negative contact via the second one of the conductive substrate sections.

2. The power transfer pad of claim 1, further comprising:
   a non-conductive material disposed across the top of the non-conducting board, wherein the raised conducting elements protrude through the non-conducting material, and wherein the non-conductive material covers the conductive substrate sections and isolates the conductive substrate sections from one another.

3. The power transfer pad of claim 1, wherein the conductive substrate sections comprise at least one of copper, gold, silver, tin, chrome or nickel.

4. The power transfer pad of claim 1, wherein each of the at least one raised conducting element comprises a conducting material added to the conductive substrate.

5. The power transfer pad of claim 1, wherein each of the at least one conducting element comprises a different contact material comprising at least one of cadmium, chrome, copper, electro-less nickel, gold, nickel, palladium, rhodium, silver, tin, tin/lead, vacuum cadmium, zinc, or platinum.

6. The power transfer pad of claim 5, wherein multiple materials are added on top of the conductive substrate.

7. The power transfer pad of claim 1, wherein the at least one conducting element comprises a repeating pattern of conducting elements on each of the individual sections of the conductive substrate on the top of the non-conductive board.

8. The power transfer pad of claim 1, wherein the conductive substrate sections are formed in a repeating pattern across the non-conductive board.

9. The power transfer pad of claim 1, wherein the conductive substrate sections are non-symmetrical and irregular.

10. The power transfer pad of claim 7, wherein the conductive substrate sections are circular.

11. The power transfer pad of claim 8, wherein the conductive substrate sections are octagonal.

12. The power transfer pad of claim 8, wherein the conductive substrate sections are hexagonal.

13. The power transfer pad of claim 8, wherein the conductive substrate sections are rectangular.

14. The power transfer pad of claim 1, wherein the conductive substrate sections are dimensioned such that different conductive substrate sections are positioned under the respective positive and negative contacts in a device to be charged when the device is positioned on top of the power transfer pad.

15. The power transfer pad of claim 14, wherein the conducting elements are dimensioned such that at least one raised conducting element contacts each of the respective positive and negative contacts in the device to be powered.

16. The power transfer pad of claim 1, wherein the at least one conducting element disposed on each of the individual sections of the conductive substrate are disposed in a graphical pattern across the top of the non-conducting board.

17. The power transfer pad of claim 16, wherein the graphical pattern is formed by the conducting elements having different sizes from one another.

18. The power transfer pad of claim 16, wherein the graphical pattern is formed by the conducting elements having different shapes from one another.

19. The power transfer pad of claim 16, wherein the graphical pattern is formed by the conducting elements having different spacings from one another.

20. The power transfer pad of claim 16, wherein the graphical pattern is formed by the conducting elements having different surface textures from one another.

21. The power transfer pad of claim 16, wherein the graphical pattern is formed by the conducting elements having different plating or finishes from one another.

22. The power transfer pad of claim 2, wherein the non-conductive material comprises a solder mask.

23. The power transfer pad of claim 2, wherein the non-conductive material comprises a filler.

24. The power transfer pad of claim 1, wherein each of the electrical contacts on the bottom of the non-conductive board are in electrical communication with one of the conductive substrate sections on the top of the non-conductive board through an electrical pathway passing through the non-conductive board.

25. The power transfer pad of claim 24, wherein the via comprises a conducting material electrically connecting one of the conducting elements on top of the non-conducting board to one of the electrical contacts on the bottom of the non-conductive board.

26. The power transfer pad of claim 25, wherein the conducting material in the via is integral with the conducting element section and the electrical contacts.

27. The power transfer pad of claim 1, wherein the via is filled with solder.

28. The power transfer pad of claim 1, wherein the via is filled with at least one of cadmium, chrome, copper, electroless nickel, gold, nickel, palladium, rhodium, silver, tin, tin/lead, vacuum cadmium, zinc, or platinum.

29. The power transfer pad of claim 1, wherein the via is filled with a non-conductive material.

30. The power transfer pad of claim 1, wherein the conducting substrates comprises copper.

31. The power transfer pad of claim 1, wherein the plurality of electrical contacts on the bottom of the non-conductive board comprise:
a plurality of conductive substrate sections disposed across the bottom of the non-conductive board; and
at least one raised conducting element disposed on each of the conductive substrate sections disposed across the bottom of the non-conductive board.

32. The power transfer pad of claim 31, further comprising:
a non-conductive material disposed across the bottom of the non-conductive board, wherein the raised conducting elements protrude through the non-conductive material, and wherein the non-conductive material covers the conductive substrate sections and isolates the conductive substrate sections from one another.

33. A charging plate structure having a top surface for temporary placement of an electrical device to be charged, comprising:
a non-conductive board having a top and a bottom;
a plurality of conductive substrate sections disposed across the top of the non-conductive board, with each conductive substrate section having an upper surface defining a respective charging area;
non-conductive material overlying the non-conductive board laterally between the conductive substrate sections to insulate the conductive substrate sections from each other across the top of the non-conductive board;
a plurality of conducting elements disposed across the charging areas to define the top surface for temporary placement of an electrical device to be charged, with each conducting element projecting upward from the upper surface of a respective conductive substrate section;
non-conductive material overlying the upper surfaces of the conductive substrate sections laterally between the upwardly projecting conducting elements to insulate the conducting elements from each other laterally across and between adjacent charging areas; and
logic circuitry configured to identify a positive contact and a negative contact on the electrical device when the electrical device is placed on the top surface of the charging plate, wherein the positive and negative contacts are identified by determining that a first one of the conductive substrate sections is electrically coupled to the positive contact and a second one of the conductive substrate sections is electrically coupled to the negative contact,
the logic circuitry being further configured to cause the first one of the conductive substrate sections to supply a positive charge to the positive contact and to cause the second one of the conductive substrate sections to supply a negative charge to the negative contact.

34. A charging plate structure as defined in claim 33 further comprising a plurality of electrical contacts on the bottom of the non-conductive board, and vias providing one-to-one electrical communication between individual electrical contacts on the bottom of the non-conductive board and individual conductive substrate sections on the top of the non-conductive board.

35. A charging plate structure as defined in claim 33 wherein each conductive substrate section has a plurality of the conducting elements projecting upward from the respective upper surface within the respective charging area.

36. A charging plate structure as defined in claim 35 wherein the conducting elements are arranged in patterns that repeat among a plurality of the conductive substrate sections to impart repeated visual appearances to the respective charging areas at the top surface.

37. A charging plate structure as defined in claim 35 wherein the conducting elements are arranged in patterns that vary among a plurality of the conductive substrate sections to impart varied visual appearances to the respective charging areas at the top surface.

38. A charging plate structure as defined in claim 37 wherein the varied visual appearances of the charging areas at the top surface define a graphical image.

39. A charging plate structure as defined in claim 37 wherein the varied visual appearances of the charging areas at the top surface define lettering.

40. A power transfer device for charging an electrical device that includes a positive charging contact and a negative charging contact, comprising:
- a charging plate that includes a plurality of conductive substrate sections, each of the plurality of conductive substrate sections being electrically isolated from other ones of the plurality of conductive substrate sections; and
- logic circuitry configured to control a supply of power to each of the plurality of conductive substrate sections;
- wherein the plurality of conductive substrate sections are configured such that when the electrical device is positioned on the power transfer pad, the positive charging contact is electrically coupled to a first one of the plurality of conductive substrate sections and the negative charging contact is electrically coupled to a second one of the plurality of conductive substrate sections;
- wherein the logic circuitry is configured to identify that the positive charging contact is electrically coupled to the first one of the plurality of conductive substrate sections and that the negative charging contact is electrically coupled to the second one of the plurality of conductive substrate section, and in response cause the first one of the plurality of conductive substrate sections to supply a positive charge to the positive charging contact and the second one of the plurality of conductive substrate sections to supply a negative charge to the negative charging contact.

41. The power transfer device of claim 40, wherein the plurality of conductive substrate sections each include a plurality of raised conducting elements for making electrical contact with the positive and negative charging contacts of the electrical device.

42. The power transfer device of claim 40, wherein the plurality of conductive substrate sections are hexagonal.

43. The power transfer device of claim 41, wherein the raised conducting elements are arranged in a pattern to define a graphical image one the charging plate.

* * * * *